United States Patent
Burger et al.

(10) Patent No.: US 9,753,070 B2
(45) Date of Patent: Sep. 5, 2017

(54) EVALUATION METHOD AND EVALUATION DEVICE FOR A CAPACITIVE CONTACT SENSOR

(75) Inventors: Stefan Burger, München (DE); Holger Steffens, München (DE)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 482 days.

(21) Appl. No.: 14/129,419

(22) PCT Filed: Jun. 28, 2012

(86) PCT No.: PCT/EP2012/062651
§ 371 (c)(1),
(2), (4) Date: Aug. 11, 2014

(87) PCT Pub. No.: WO2013/004603
PCT Pub. Date: Jan. 10, 2013

(65) Prior Publication Data
US 2015/0015279 A1    Jan. 15, 2015

(30) Foreign Application Priority Data

Jul. 1, 2011    (DE) .................. 10 2011 078 534

(51) Int. Cl.
*G01R 27/26* (2006.01)
*H03K 17/96* (2006.01)
*G01D 5/24* (2006.01)

(52) U.S. Cl.
CPC .......... *G01R 27/2605* (2013.01); *G01D 5/24* (2013.01); *H03K 17/962* (2013.01); *H03K 2217/96054* (2013.01); *H03K 2217/960775* (2013.01)

(58) Field of Classification Search
CPC ...... G01R 27/2605; G01D 5/24; H03K 17/74; H03K 17/98; H03K 17/962; H03K 17/955
See application file for complete search history.

(56) References Cited

U.S. PATENT DOCUMENTS

| | | | |
|---|---|---|---|
| 4,175,239 A | 11/1979 | Sandler | 307/116 |
| 6,445,294 B1 | 9/2002 | Mcdonnell et al. | 340/562 |

(Continued)

FOREIGN PATENT DOCUMENTS

| | | | |
|---|---|---|---|
| CN | 101217273 A | 7/2008 | G01D 5/241 |
| CN | 101368977 A | 2/2009 | G01P 3/42 |

(Continued)

OTHER PUBLICATIONS

European Office Action, Application No. 12731430.0, 6 pages, Nov. 16, 2015.

(Continued)

*Primary Examiner* — Minh N Tang
(74) *Attorney, Agent, or Firm* — Slayden Grubert Beard PLLC

(57) ABSTRACT

In an evaluation method for a capacitive contact sensor with at least one transmitting and at least one receiving electrode, which are able to be brought into a capacitive coupling, —at the at least one receiving or sensor electrode a measurement signal is tapped, which represents the temporal course of the coupling capacitance between the at least one transmitting electrode and the at least one receiving electrode and the temporal course of the capacitive load of the sensor electrode, respectively, —a reference signal is created from the measurement signal, and —at least one detection signal is created, when the reference signal meets at least one detection criterion. An evaluation device may be coupled with at least one transmitting electrode and at least one receiving electrode or with at least one sensor electrode of the capaci- (Continued)

tive contact sensor and is adapted to carry out the above evaluation method.

35 Claims, 7 Drawing Sheets

(56) References Cited

U.S. PATENT DOCUMENTS

| | | | |
|---|---|---|---|
| 6,859,141 B1* | 2/2005 | Van Schyndel | G01S 13/04 324/658 |
| 7,626,148 B2 | 12/2009 | Ito | 219/620 |
| 8,773,146 B1* | 7/2014 | Hills | G01N 27/22 324/658 |
| 8,922,522 B2 | 12/2014 | Atsuta et al. | 345/174 |
| 9,124,274 B2 | 9/2015 | Kaltner et al. | H03K 17/962 |
| 9,141,174 B2 | 9/2015 | Unterreitmayer et al. | |
| 2009/0224775 A1 | 9/2009 | Nishizono | 324/658 |
| 2010/0244860 A1 | 9/2010 | Wisspeintner et al. | 324/679 |
| 2011/0025345 A1* | 2/2011 | Unterreitmayer | G06F 1/3231 324/600 |
| 2011/0169768 A1 | 7/2011 | Matsushima | 345/174 |
| 2012/0026121 A1* | 2/2012 | Unterreitmayer | G06F 1/1613 345/174 |

FOREIGN PATENT DOCUMENTS

| | | | | |
|---|---|---|---|---|
| CN | 1989694 A | 6/2010 | | H01H 36/00 |
| CN | 101842985 A | 9/2010 | | E05F 15/00 |
| CN | 101849217 A | 9/2010 | | G06F 3/033 |
| DE | 102009057935 A1 | 6/2011 | | G01D 5/24 |
| EP | 1160400 A1 | 12/2001 | | B60R 25/00 |
| EP | 1775836 A1 | 4/2007 | | H03K 17/96 |
| JP | 2007150733 A | 6/2007 | | H01H 36/00 |
| JP | 2012078924 A | 4/2012 | | G06F 3/041 |
| WO | 2007/150058 A2 | 12/2007 | | F21L 14/02 |
| WO | 2010/004867 A1 | 1/2010 | | G06F 3/041 |
| WO | 2011/069926 A2 | 6/2011 | | H03K 17/96 |
| WO | 2013/004603 A2 | 1/2013 | | H03K 17/96 |

OTHER PUBLICATIONS

Chinese Office Action, Application No. 201280039519.X, 21 pages, Dec. 30, 2015.
International Search Report and Written Opinion, Application No. PCT/EP2012/062651, 20 pages, Feb. 18, 2013.
Japanese Office Action, Application No. 2014517724, 8 pages, Apr. 27, 2016.
Taiwan Office Action, Application No. 101123658, 9 pages, Jul. 4, 2016.
Chinese Office Action, Application No. 201280039519.X, 37 pages, Aug. 17, 2016.
Chinese Rejection Decision, Application No. 201280039519.X, 40 pages, Apr. 1, 2017.

* cited by examiner

EVALUATION METHOD AND EVALUATION DEVICE FOR A CAPACITIVE CONTACT SENSOR

CROSS-REFERENCE TO RELATED APPLICATIONS

This application is a U.S. National Stage Application of International Application No. PCT/EP2012/062651 filed Jun. 28, 2012, which designates the United States of America, and claims priority to DE Patent Application No. 10 2011 078 534.5 filed Jul. 1, 2011. The contents of which are hereby incorporated by reference in their entirety.

TECHNICAL FIELD

The invention relates to an evaluation method for a capacitive contact sensor. In addition, the invention relates to an evaluation device for a capacitive contact sensor, which is adapted to carry out the evaluation method according to the invention. In addition, provided by the invention is an electric handheld device comprising the evaluation device according to the invention.

BACKGROUND

Known from prior art are capacitive contact sensors, which may be arranged at a handheld device, in particular a cell phone, to detect a contact with and a grasping of, respectively, the electric handheld device by a hand. When a contact with and a grasping of, respectively, the electric handheld device is detected, the electric handheld device may, for example, be transferred from a sleep mode into an operating mode. After the change of the operating mode, and at a detection of a grasping of the electric handheld device, still further functions may be activated in the electric handheld device. For example, the detection of the grasping of a cell phone by a hand may be used to answer an incoming call once the cell phone is grasped by the hand.

However, a function assigned to a grasping of the handheld device only may be carried out, when in fact a grasping of the handheld device takes place. For example, a call coming in at a cell phone cannot be answered by grasping the cell phone by a hand, when the cell phone already is grasped by the hand during the incoming of the call. When the electric handheld device already is grasped by a hand a further operation of the handheld device cannot anymore be detected on a capacitive basis. Further functions of the handheld device, for example answering a call, only can be activated in a conventional manner, for example by actuating a mechanical key.

SUMMARY

According to various embodiments, solutions can be provided, which allow for a detection of an operational input, for example at an electric handheld device, on a capacitive basis also in cases where the handheld device already is grasped by a hand.

According to various embodiments, provided is an evaluation method for a capacitive contact sensor, which comprises at least one transmitting electrode and at least one receiving electrode, which are able to be brought into a capacitive coupling, wherein at the at least one receiving electrode a measurement signal is tapped, which represents the temporal course of the coupling capacitance between the at least one transmitting electrode and the at least one receiving electrode, a reference signal is formed from the measurement signal, and at least one detection signal is generated, when the reference signal meets at least one detection criterion.

Also provided is an evaluation method for a capacitive contact sensor, which comprises at least one sensor electrode, wherein a measurement signal is tapped at the at least one sensor electrode, which represents the temporal course of a capacitive load between the sensor electrode and a reference ground, a reference signal is formed from the measurement signal, and at least one detection signal is generated, when the reference signal meets at least one detection criterion.

In the following, advantageous embodiments of the two above described evaluation methods are specified.

The measurement signal may be low-pass filtered, wherein following the low-pass filtering of the measurement signal a difference signal between the measurement signal and the low-pass filtered measurement signal is formed, wherein the difference signal represents the reference signal.

The forming of the reference signal may comprise one of differentiation of the measurement signal and high-pass filtering of the measurement signal.

The detection criterion may comprise an upper threshold value and/or a lower threshold value.

The detection criterion may comprise an upper limiting value and/or a lower limiting value. Preferably, the upper limiting value lies above the upper threshold value and the lower limiting value lies below the lower threshold value.

A first detection signal may be generated, when the reference signal lies below the lower threshold value.

A second detection signal may be generated, when the reference signal lies above the upper threshold value.

A first detection signal may be generated, when the reference signal lies below the lower threshold value and above the lower limiting value.

A second detection signal may be generated, when the reference signal lies above the upper threshold value and below the upper limiting value.

Preferably, the first detection signal and the second detection signal are digital signals, wherein an information signal is generated, when the detection signals meet at least one information criterion.

The information criterion, for example, may be:
the temporal interval
between the rising edges of two pulses of the first detection signal, or
between the rising edges of two pulses of the second detection signal, or
between the rising edge of a pulse of the first detection signal and the rising edge of a pulse of the second detection signal
exceeds or falls below a predefined value,
the pulse duration of a pulse of the first detection signal or of a pulse of the second detection signal exceeds or falls below a predefined value,
within a predefined time period the first detection signal or the second detection signal or the first detection signal and the second detection signal comprise a predefined number of pulses and/or
the succession of pulses of the first detection signal and of the second detection signal has a certain pattern.

The coupling capacitance may be measured using a transmission method or using an absorption method. The capacitive load may be measured using a loading method.

The measurement signal may be sampled using a predefined first sampling rate, when the signal level of the measurement signal lies below a predefined reference level. The measurement signal may be sampled using a predefined second sampling rate, when the signal level of the measurement signal lies above the predefined reference level.

Preferably, the first sampling rate is lower than the second sampling rate.

The measurement signal may be amplified using a predefined first amplification, when the signal level of the measurement signal lies below a predefined reference level. The measurement signal may be amplified using a predefined second amplification, when the signal level of the measurement signal lies above the predefined reference level, wherein the second amplification is chosen such that the measurement signal always stays in the operating range of the capacitive contact sensor.

At least one second measurement signal may be tapped at the receiving electrode or at the sensor electrode, wherein prior to the forming of the reference signal the measurement signal and the at least one second measurement signal are combined with one another and wherein the reference signal is formed from the combined measurement signal.

The measurement signals (measurement signal and second measurement signal) may be subjected to a signal pre-processing prior to combining.

Further provided is an evaluation device for a capacitive contact sensor, which may be coupled with at least one transmitting electrode and at least one receiving electrode or with at least one sensor electrode of the capacitive contact sensor and which is adapted to carry out an evaluation method according to various embodiments.

In addition, provided is an electric handheld device at which at least one transmitting electrode and at least one receiving electrode or at least one sensor electrode are arranged, which are coupled with an evaluation device, wherein the evaluation device is adapted to carry out an evaluation method according to various embodiments.

The electric handheld device may comprise at least one of a mobile radio unit, a remote control, input means for gaming consoles, a portable mini computer, a smart phone, a computer mouse, and input means for computer.

The electric handheld device may be designed to be deformable, wherein a deformation of the handheld device causes a variation of the coupling capacitance between the at least one transmitting electrode and the at least one receiving electrode.

BRIEF DESCRIPTION OF THE DRAWINGS

Further details and characteristics of the invention result from the following description together with the drawing.

FIG. 6b shows a reference signal, which is formed from the difference of the signals shown in FIG. 6a.

DETAILED DESCRIPTION

Figure 1:
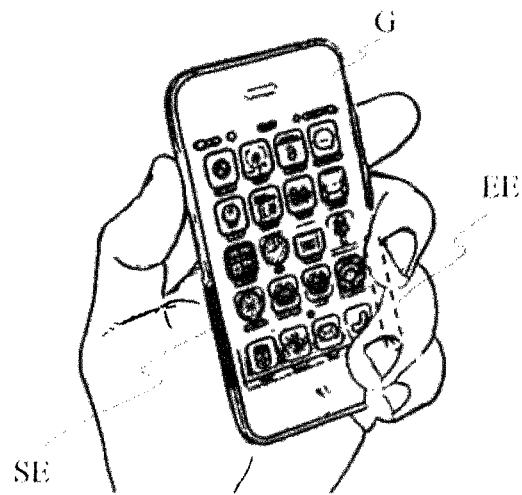
FIG. 1 shows an electric handheld device grasped by a hand.

FIG. 1 shows an electric handheld device, for example a cell phone G, which is grasped by a hand. The cell phone comprises a capacitive contact sensor by means of which the grasping of the handheld device G may be detected. The capacitive contact sensor comprises at least one receiving electrode EE and at least one transmitting electrode SE. In the cell phone shown in FIG. 1 the transmitting electrode SE is arranged at the left side, i.e. at the left side wall of the cell phone G. The receiving electrode EE is arranged at the right side, i.e. at the right side wall of the cell phone G, and is covered by the fingers of the hand in the example shown here.

Once the cell phone G is grasped by the hand, a capacitive coupling between the transmitting electrode SE and the receiving electrode EE results. Also, as a result of the grasping an existing weak capacitive coupling between the electrodes SE and EE may be amplified (transmission method, see FIG. 2a) or weakened (absorption method, see FIG. 2a). The transmitting electrode SE is loaded with an electric alternating signal so that an electric alternating field is emitted, which couples into the receiving electrode EE via the hand during grasping the cell phone G. The part of the electric alternating field emitted at the transmitting electrode SE and coupled into the receiving electrode EE via the hand causes a variation of the electric current in the receiving electrode EE, which can be detected by an evaluation device.

The transmitting electrode SE and the receiving electrode EE also may be arranged at an electric handheld device such that they are able to be brought into a capacitive coupling also without a grasping by a hand. For example, the handheld device may be designed in a deformable manner so that a strong squeezing of the handheld device by a hand leads to a temporary deformation. Preferably, in a deformable handheld device the transmitting electrode SE and the receiving electrode EE are arranged thereon such that a temporary deformation leads to a variation of the distance between the two electrodes SE and EE. Coming along with the variation of the distance also is a variation of the capacitive coupling between the two electrode SE and EE, which in the receiving electrode EE in turn causes a variation of the electric current, which may be detected by an evaluation device.

In addition, the electrodes SE and EE are arranged at the handheld device G such or arranged relative to one another at the handheld device G such that a movement of a finger relative to the surface of the handheld device also in cases, where the handheld device is grasped by a hand, results in a variation of the capacitive coupling between the two electrode SE and EE, which in turn may be detected by the evaluation device according to various embodiments.

The capacitive contact sensor also may comprise only one or several sensor electrodes SE/EE (not shown in FIG. 1). The sensor electrode SE/EE may be arranged at the left side, i.e. at the left side wall of the cell phone G, or at the right side, i.e. at the right side wall of the cell phone G. However, the sensor electrode SE/EE may also be arranged at the front or at the back of the cell phone G.

With the grasping of the cell phone G such that the sensor electrode SE/EE is covered by the hand at least partially the capacitive load (loading method, see FIG. 2b) between the sensor electrode SE/EE and a reference ground changes. This variation may be detected by the evaluation device.

With only one sensor electrode SE/EE substantially a movement of a finger relative to the surface of the handheld device may be detected. With at least two sensor electrodes SE/EE, which substantially are arranged at two opposite side walls of the electric handheld device, also a grasping of the handheld device may be detected reliably.

This way, for the first time, it is feasible in an advantageous manner to detect an operation of a handheld device on a capacitive basis also when the handheld device already has been grasped by a hand. In a manner according to various embodiments this in particular is made possible by the evaluation method according to various embodiments, which is described in more detail in the following.

Figure 2A:
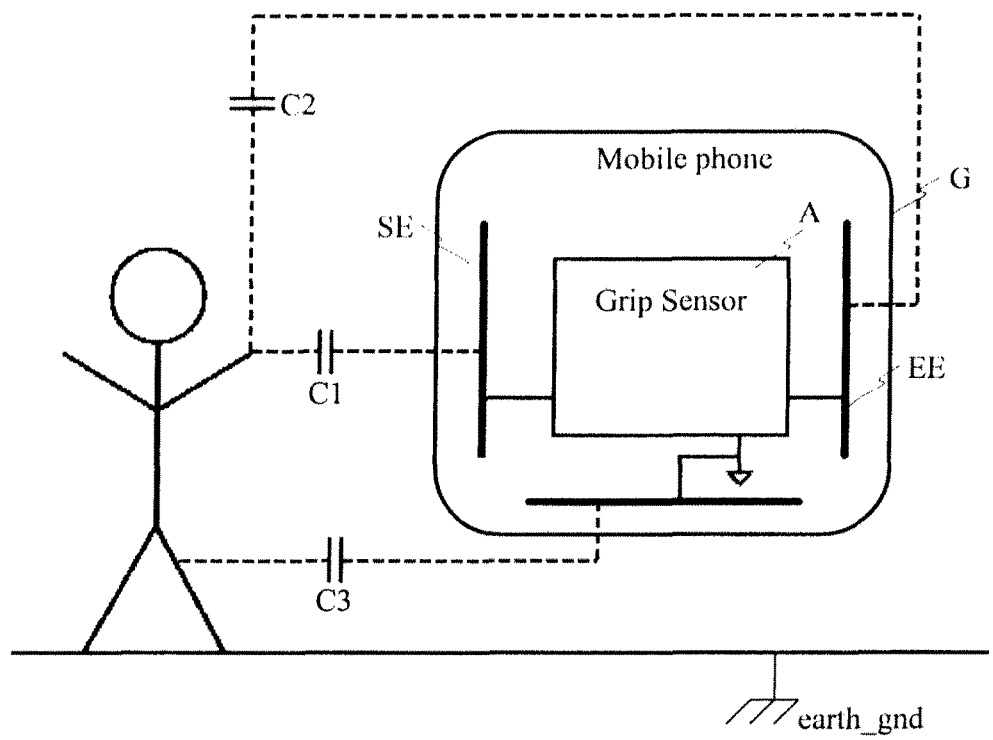
FIG. 2a shows an equivalent circuit diagram for a clarification of the mode of operation of a capacitive sensor according to various embodiments, which is operated according to a transmission method and/or an absorption method.

FIG. 2a shows an equivalent circuit diagram of a capacitive sensor according to various embodiments at a handheld device, which is grasped by a hand, and which operates according to the transmission method and the absorption method, respectively. During grasping of the handheld device G by a hand the coupling capacitance between the transmitting electrode SE and the receiving electrode EE varies, which here are given as coupling capacitance C1 between the transmitting electrode SE and the hand and as coupling capacitance C2 between the hand and the receiving electrode EE. The variation of the coupling capacitance C1, C2 between the transmitting electrode and the receiving electrode EE may be measured and detected, respectively, as a variation of the electric current in the receiving electrode EE. Depending on the specific grounding conditions of the capacitive sensor an approach and a grasping, respectively, leads to a reduction (absorption) or to an increase (transmission) of the capacitive coupling between the electrodes SE and EE.

The receiving electrode EE and the transmitting electrode SE each are coupled with an evaluation device A. The evaluation device A on the one hand is provided for loading the transmitting electrode SE with an electric alternating signal so that an electric alternating field may be emitted from it, which is coupled into the receiving electrode via the hand. On the other hand, the evaluation device A also is provided for analyzing an electric signal (measurement signal) tapped at the receiving electrode EE, i.e. to detect and to evaluate a temporal variation of the electric current in the receiving electrode EE.

When the electric handheld device grasped by the hand is squeezed stronger, the coupling capacitance C1, C2 changes, which in turn influences the level of the electric current in the receiving electrode EE. When a fast squeezing of the handheld device is carried out with the hand grasping the handheld device (fast squeezing of the handheld device by the hand such that the geometry of the handheld device changes, even if only little, and/or such that the capacitive coupling between the electrodes and the hand changes), this results in an escalated rise of the electric current in the receiving electrode EE, which may be detected and evaluated, respectively, using the method according to various embodiments. In addition, also a movement of a finger of the hand grasping the handheld device G relative to the surface of the handheld device (preferably an approach towards the handheld device and a removing from the handheld device, respectively) results in a variation, preferably in an escalated rise and decrease, respectively, of the electric current in the receiving electrode EE.

The temporal variation of a coupling capacitance C1, C2 generally may be caused by a variation of the distance, for example of a finger to the handheld device (also when the handheld device is grasped by the hand) and/or by a variation of the effectively active coupling surface between the electrodes and, for example, the hand of the user (when the handheld device is squeezed stronger then normal also the effective coupling surface is increased).

Figure 2B:
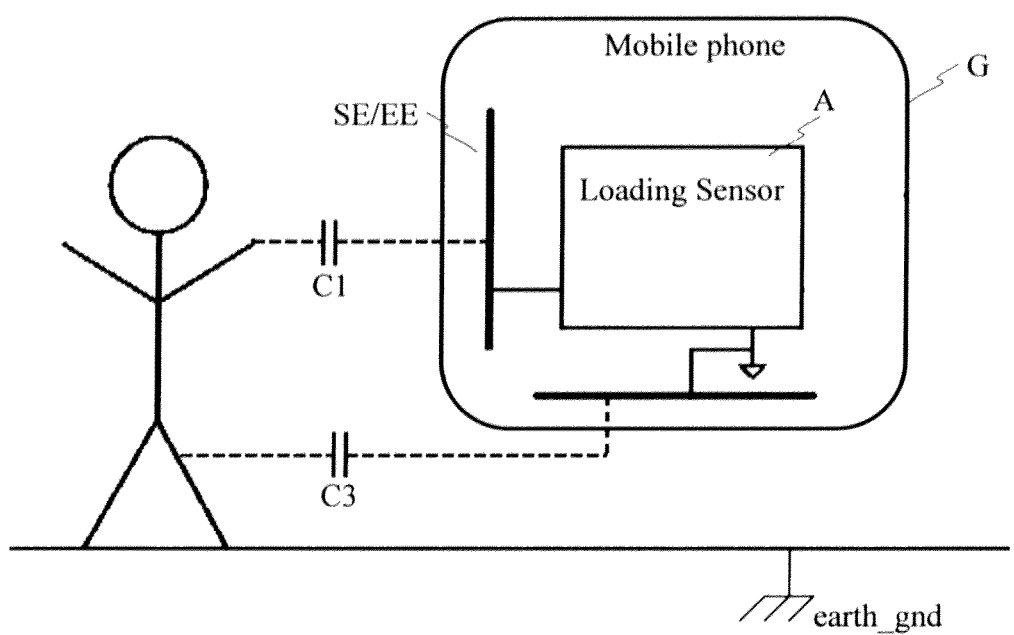
FIG. 2b shows an equivalent circuit diagram for a clarification of the mode of operation of a capacitive sensor according to various embodiments, which is operated according to a loading method.

In practice, a variation of the coupling capacitance C1, C2 approximately varies between the following states (between state (A) and state (B)) (this is also true for the variation of the capacitive load at the sensor electrode SE/EE according to the loading method, see FIG. 2b):

(A) For example, the device is positioned on the table
(B) The device is grasped with the hand
⇒ This substantially corresponds to a change of distance between hand and device and in the following also is denoted as "grip".
(A) The device is positioned on the hand
(B) The device is grasped with the hand
⇒ This substantially corresponds to a change of distance between hand and device
(A) The device is grasped with a low grasping force
(B) The device is grasped with a high grasping force
⇒ This substantially corresponds to a change in the surface of the touching surfaces of the fingers and the palm, respectively, and in the following is denoted as "squeeze".
(A) The device is grasped with the hand, wherein thumb and/or finger rest on the surface of the device
(B) The device is grasped with the hand, wherein thumb and/or one or several fingers do not rest on the surface of the device, i.e. thumb and/or one or several fingers intentionally are lifted from the surface of the device (removed) and/or preferably again quickly are rested on the surface of the device
⇒ This substantially corresponds to a change in surface and/or a change in distance and in the following also will be denoted "tap on grip".

With respect to the starting position (rest position) of the thumb and the fingers, respectively, it may be differentiated between the thumb/the fingers rest on the surface of the device
the thumb/the fingers do not rest on the surface of the device.

The user of the handheld device intentionally may switch between the above described states and this way may create a temporal variation of the coupling capacitance C1, C2.

FIG. 2b shows an equivalent circuit diagram of a capacitive sensor according to various embodiments at a handheld device, which is grasped by a hand, and which operates according to the loading method.

During operation of the capacitive sensor in the loading method only one sensor electrode SE/EE is required, which represents a transmitting electrode as well as a receiving electrode. At the sensor electrode SE/EE, which also is denoted as loading electrode, an electric alternating signal is supplied, so that an electric alternating field is emitted from there, wherein the capacitive load of the sensor electrode SE/EE is detected and analyzed, respectively, by the evaluation device.

In the loading method, substantially, the capacitive load between the sensor electrode and a reference ground of the capacitive sensor is used for detecting an approach and a grasping, respectively. A capacitive load means that the strength of an electric field being effective from the sensor electrode SE/EE to the reference ground is increased by the approach of an electrically conductive hand and therefore the capacitance C1, C3 between sensor electrode SE/EE and reference ground increases. The capacitive load therefore is a measure for the strength of an electric field effective from the sensor electrode SE/EE to the reference ground and a measure for the capacitance C1, C3 between sensor electrode SE/EE and reference ground, respectively.

Also several sensor electrodes SE/EE and loading electrodes may be arranged at the handheld device, wherein for each sensor electrode SE/EE the capacitive load may be detected. This way, in a simple manner also a grasping of the handheld device by a hand may be detected. In an embodiment a first sensor electrode SE/EE may be arranged at the left sidewall and a second sensor electrode SE/EE may be arranged at the right sidewall.

The detection and the evaluation, respectively, of the variation of the electric current in the receiving electrode EE and the sensor electrode SE/EE, respectively, will be described in more detail in the following with reference to FIG. 3 to FIG. 7 with the help of the sensor device according to FIG. 2a. The evaluation and the evaluation method, respectively, in a respective manner also may be used for the loading method shown with reference to FIG. 2b.

Figure 3:
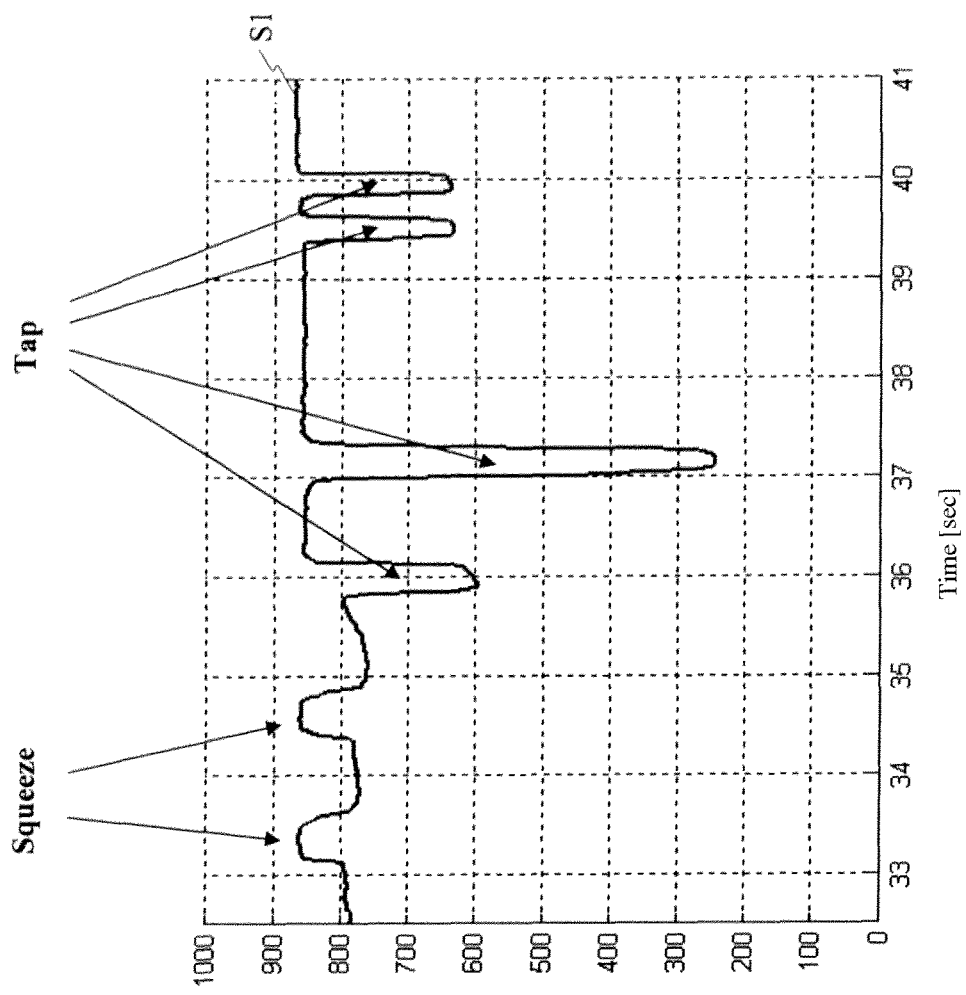
FIG. 3 shows the temporal course of the amplitude of a measurement signal tapped at a receiving electrode of the capacitive sensor device according to various embodiments, in which the capacitance variation of a capacitive sensor caused by squeezing an electric handheld device with a hand and/or caused by a temporary lifting of a finger from the handheld device can be seen.

FIG. 3 shows the temporal course of the amplitude of a measurement signal S1 tapped at the receiving electrode EE, which is shown in digitized form here. The measurement signal S1 initially has a level, which is indicative for the fact that the electric handheld device is grasped by a hand.

When the electric handheld device is not grasped by a hand, the analog signal tapped at the receiving electrode EE may be digitized using a first sampling rate. For example, the analog signal may be digitized and sampled, respectively, using a first sampling rate of about 10 Hz. A low sampling rate in many cases is sufficient to reliably detect a grasping of the handheld device. The low first sampling rate may be maintained as long as the analog signal is below a predefined signal level, wherein a falling below the predefined signal level is not caused by a squeezing of the handheld device as described above, or by a removing and approaching, respectively, a finger.

After the electric handheld device has been grasped by the hand the signal level of the measurement signal S1 substantially stays constant approximately until time t=33.

About between time t=33 and time t=34 as well as between time t=34 and time t=35 each a quick squeezing of the device is carried out by the user of the electric handheld device. The quick squeezing in each case results in an escalated rise of level, which is visible distinctly in the measurement signal S1.

About at time t=36 and at time t=37 the handheld device still is grasped by a hand—a finger, for example a thumb, which rests on the surface of the handheld device, temporarily is removed from the handheld device, which in each case results in an escalated fall of the level of the measurement signal S1. Between time t=39 and time t=40 in short intervals a finger, which rests on the surface of the handheld device, temporarily is removed from the handheld device, which in turn results in an escalated fall of the level of the measurement signal S1. The escalated falls of level shown here also may be effected by an approach/removal of several fingers.

In order to be able to reliably detect a quick squeezing of the device and a quick removing/approaching of a finger it is advantageous to use, after the detection of the grasping of the handheld device by a hand, a second sampling rate for sampling the measurement signal, which is greater than the first sampling rate for detecting the grasping. The second sampling rate may be about 20 Hz to 50 Hz. Depending on the specific requirement the second sampling rate also may be greater than 50 Hz.

After releasing the handheld device again the first sampling rate may be used.

In case already the first sampling rate has a value, which is also sufficient for the detection of a quick squeezing and a quick removing/approaching of a finger, respectively, a variation of the sampling rate may be forgone.

Figure 4:
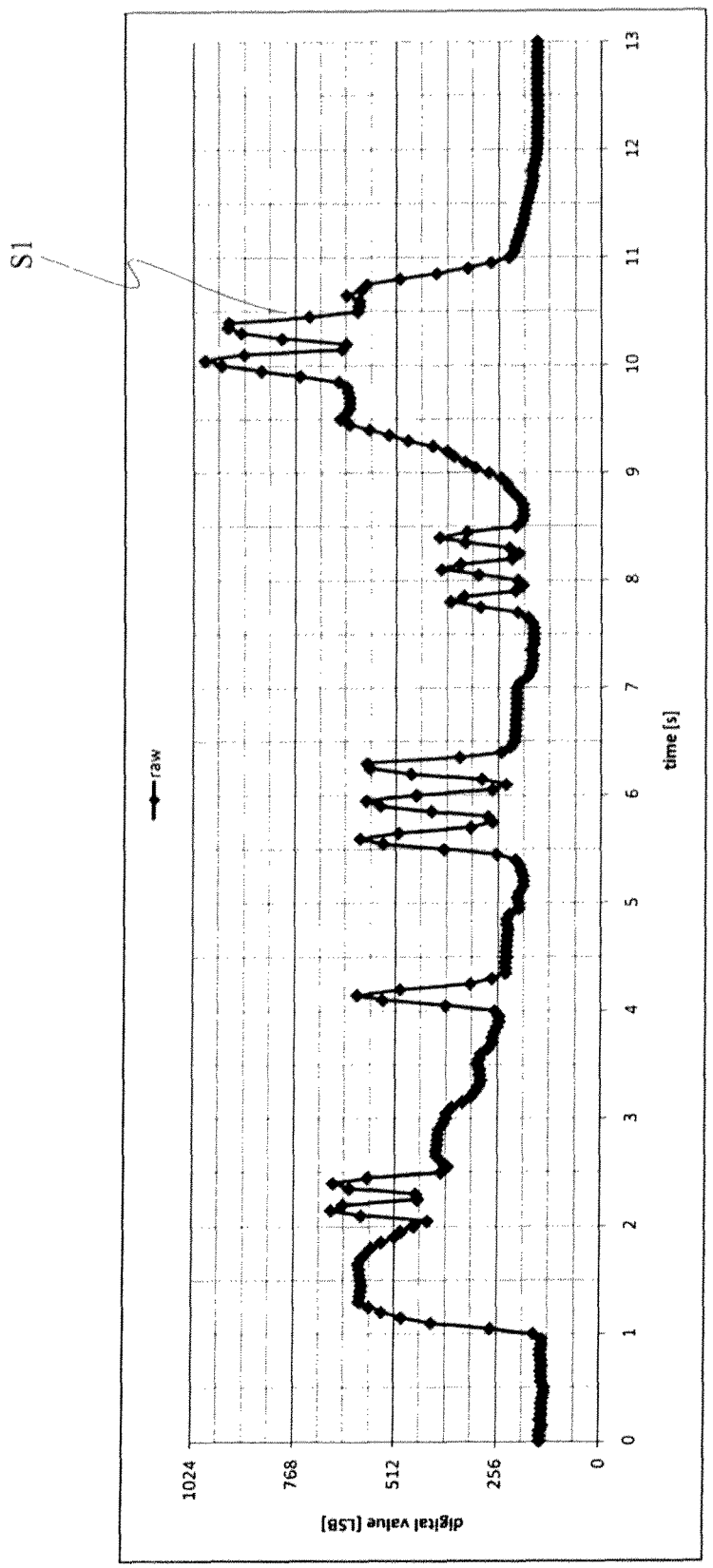
FIG. 4 shows a signal tapped at a receiving electrode of a capacitive sensor, in which a number of peaks is visible, which represent a squeezing of the electric handheld device and/or a temporary lifting of a finger from the handheld device.

FIG. 4 shows the temporal course of a measurement signal S1 tapped at the receiving electrode EE. Following a grasping of the handheld device the user carries out several inputs by quick temporary squeezings of the device G. The quick inputs by means of squeezing in each case result in an escalated rise of the level of the measurement signal S1, which here can be seen as peaks in the measurement signal S1. Also visible here is a rise of level at time t=1, which, however, does not represent a quick temporary squeezing of the handheld device G, but rather a strong squeezing of the handheld device for a longer time. In a preferable embodiment, however, only a quick and temporary squeezing of the handheld device shall be detected as an input, so that in the course of the signal shown in FIG. 4 only eleven user inputs shall be detected. In another embodiment the peaks in the measurement signal S1 in each case also may be caused by a temporary removal/approach of a finger.

It is advantageous that the measurement signal S1 tapped at the receiving electrode first is digitized and then is subjected to a frequency analysis and a measurement signal pre-processing, respectively.

It also may be advantageous to amplify the measurement signal prior to the evaluation. In addition, it may be advantageous to amplify the measurement signal after the detection of the grasping such that the amplified measurement signal always is inside the operating range of the evaluation device so that the measurement signal during an escalated rise of the level does not reach a limitation, which would result in a clipping of the measurement signal. The amplification during the grasping may also be adapted dynamically with time, for example to be able to react to different ambient conditions.

Figure 5A:
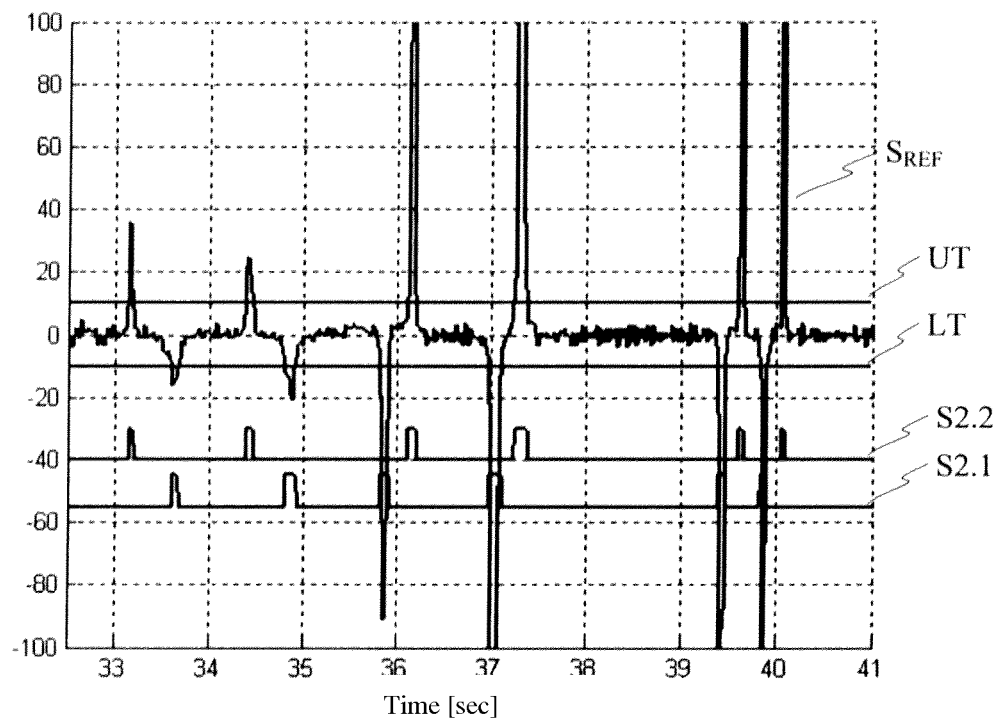
FIG. 5a shows a differentiated signal (reference signal) of a measurement signal comprising two threshold values which is tapped at the receiving electrode and the sensor electrode, respectively, of a capacitive sensor, as well as two digital signals (detection signals) derived from the differentiated signal.

FIG. 5a shows the differentiated signal (reference signal $S_{REF}$) of the measurement signal S1 shown in FIG. 3, which has been tapped at the receiving electrode of a capacitive sensor according to various embodiments. By means of the differentiation of the measurement signal S1 the rate of change of the measurement signal may be determined. In addition, it is accomplished by the differentiation and the derivative, respectively, of the measurement signal S1 tapped at the receiving electrode EE that slow changes in level, which, for example, are caused by a slow approach/removing of a finger, are not recognized as a user input. Also, it is accomplished that a strong squeezing of the electric handheld device for a longer period of time again is not detected as an operational input.

Also shown in FIG. 5a (as well as in FIG. 5b and FIG. 6b, which will be described in more detail below) are an upper threshold value UT and a lower threshold value LT. Exceeding and falling below, respectively, the threshold values UT and LT, respectively, may be understood as an indication that the level of the measurement signal S1 is changing in a predefined minimum speed.

In addition, a (digital, i.e. binary) detection signal S2.2 and S2.1 is assigned to the upper threshold value UT and to the lower threshold value LT. When the reference signal $S_{REF}$ exceeds the upper threshold value UT the level of the detection signal S2.2 is set to logic HIGH. When the upper threshold value UT again is underrun then the level of the detection signal S2.2 again is set to logic LOW. In a similar manner also the detection signal S2.1 is created. When the reference signal $S_{REF}$ falls below the lower threshold value LT the level of the detection signal S2.1 is set to logic HIGH. When the lower threshold value LT is exceeded again then the level of the detection signal S2.1 again is set to logic LOW. Of course, the states LOW and HIGH also may be interchanged. The generating of the detection signals S2.1 and S2.2 described with reference to FIG. 5a in an analogous manner also applies to the detection signals S2.1 and S2.2 shown with reference to FIG. 5b and FIG. 6b.

The detection signals S2.1 and S2.2 may be evaluated and used, respectively, to activate specific device functions, as is described in more detail with reference to FIG. 6b.

As an alternative for the differentiation of the measurement signal S1 the reference signal $S_{REF}$ also may be created by means of high-pass filtering of the measurement signal.

Figure 5B:
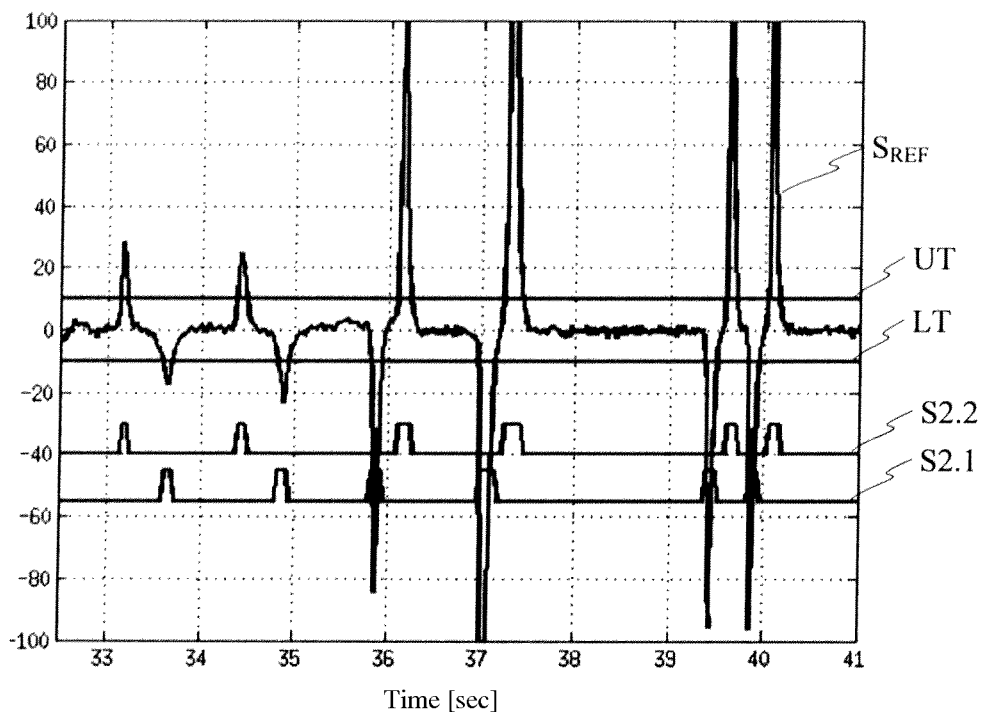
FIG. 5b shows a high-pass filtered signal (reference signal) of a measurement signal comprising two threshold values and tapped at the receiving electrode and the sensor electrode, respectively, of a capacitive sensor, as well as two digital signals (detection signals) derived from the high-pass filtered signal.

FIG. 5b shows the high-pass filtered signal (reference signal $S_{REF}$) of the measurement signal S1 shown in FIG. 3, which has been tapped at the receiving electrode of a capacitive sensor according to various embodiments. Preferably, a high-pass filter of first order is used. The reference signal $S_{REF}$ for the most part is identical to the reference signal $S_{REF}$ created by means of differentiation (see FIG. 5a). Likewise shown here are the upper threshold value UT and the lower threshold value LT as well as the detection signals S2.1 and S2.2. With respect to the threshold values UT and LT as well as the detection signals S2.1 and S2.2 reference is made to the description for FIG. 5a.

Figure 6A:
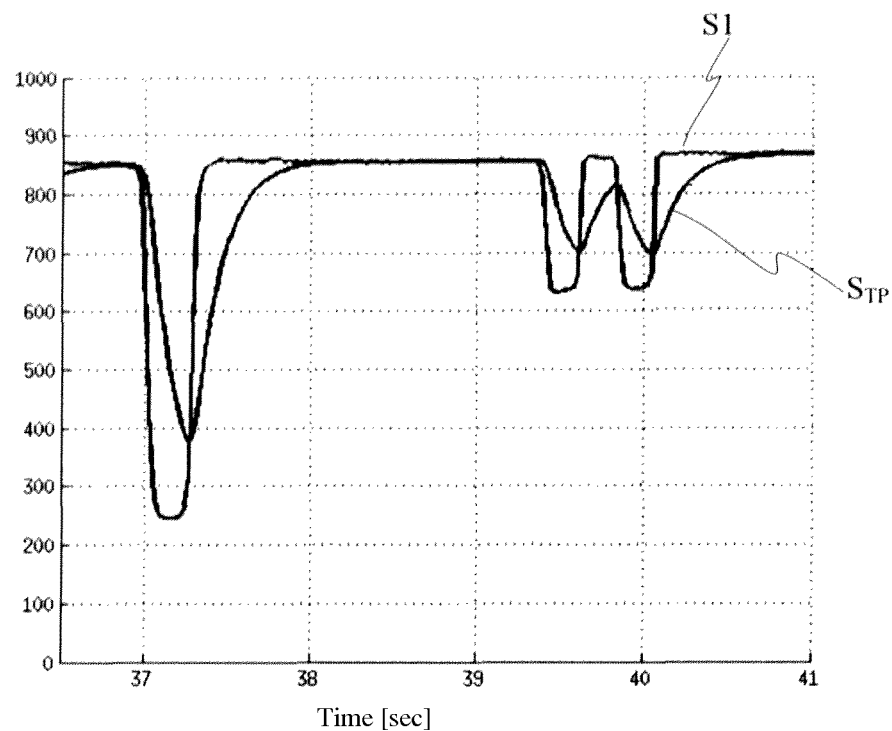
FIG. 6a shows a low-pass filtered signal of a measurement signal tapped at the receiving electrode and the sensor electrode, respectively, of a capacitive sensor.
Figure 6B:
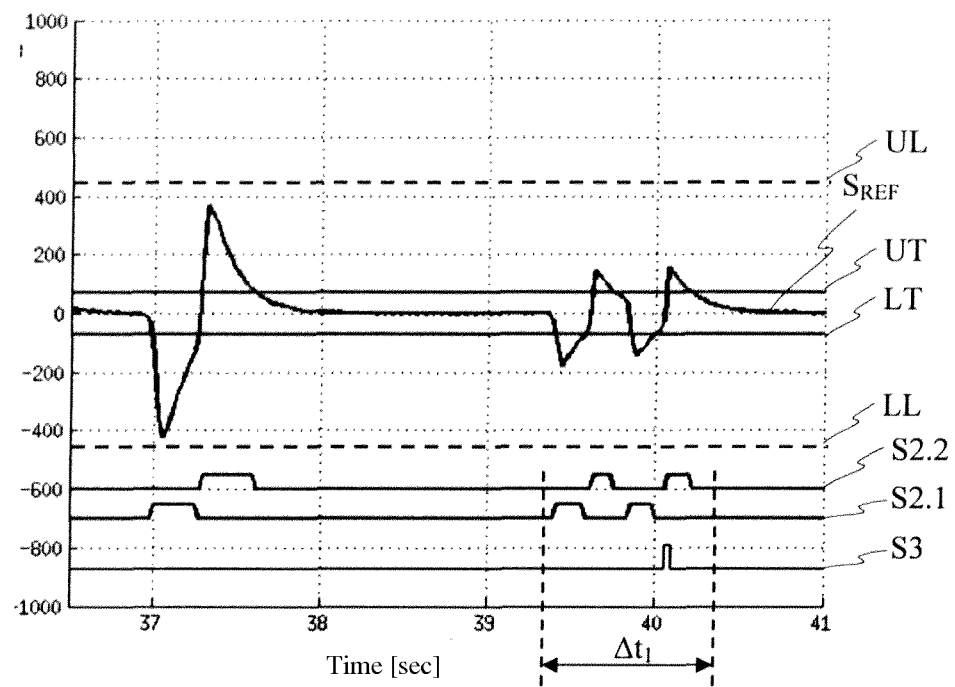

Shown with reference to FIG. 6a and FIG. 6b is an alternative for the pre-processing of the measurement signal shown in FIG. 5a and FIG. 5b, in which in a first step a low-pass filtering of the measurement signal S1 shown in FIG. 3 is carried out and in a second step a reference signal $S_{REF}$ is created from the measurement signal S1 and the low-pass filtered measurement signal.

FIG. 6a shows the low-pass filtered signal $S_{TP}$ of the measurement signal S1 shown in FIG. 3 created in a first step, which has been tapped at the receiving electrode EE of a capacitive sensor according to various embodiments. Preferably, a first order low-pass filter is used, wherein different time constants may be used for the rising and the falling edge of the measurement signal.

FIG. 6b shows the reference signal $S_{REF}$, which is created from the measurement signal S1 and the low-pass filtered measurement signal $S_{TP}$. For this, the difference between the measurement signal S1 and the low-pass filtered measurement signal $S_{TP}$ is determined (i.e., S1-$S_{TP}$). The difference between the measurement signal S1 and the low-pass filtered measurement signal $S_{TP}$ in this case is a measure for the amount of variation.

As in FIG. 5a and FIG. 5b, as a detection criterion also here an upper threshold value UT and a lower threshold value LT are defined, whose exceeding and underrunning, respectively, results in a variation of the level of the respective detection signals S2.1. and S2.2, respectively, as described with reference to FIG. 5a.

In addition, provided are an upper limiting value UL and a lower limiting value LL. For example, the limiting values UL and LL may be provided to detect runaway values in upward and downward directions and, if applicable, to filter them out, or at least leave them disregarded during creating the respective detection signals S2.1 and S22, respectively. Runaway values in upward and/or downward directions, for example, may occur with measurement errors. The robustness of the evaluation method may be improved this way. Lower and upper limiting values also may be provided for the methods shown with reference to FIG. 5a and FIG. 5b.

In all methods shown here several upper threshold values UT, several lower threshold values LT, several upper limiting values UL as well as several lower limiting values LL may be provided. In doing so it is feasible, for example, to discriminate a slow approach of a finger from a fast approach of a finger because, for example, with a suitable selection of two upper threshold values the lower threshold value in both cases is exceeded, with a slow approach, however, the higher of the two threshold values is not exceeded.

In addition, shown in FIG. 6b is an example for an information signal S3, which is created on the basis of the reference signal $S_{REF}$ and on the basis of the detection signals S2.1 and/or S2.2, respectively. The (digital and binary, respectively) information signal S3 may be created, i.e. set to logic HIGH, when the detection signals S2.1 and/or S2.2 meet at least one predefined information criterion.

Examples for an Information Criterion
a) The temporal interval
  between the rising edges of two (successive) pulses of the first detection signal S2.1, and/or
  between the rising edges of two (successive) pulses of the second detection signal S2.2, and/or
  between the rising edge of a pulse of the first detection signal S2.1 and the rising edge of a pulse of the second detection signal S2.2
exceeds or underruns a predefined value.
b) The pulse duration of a pulse of the first detection signal S2.1 or of a pulse of the second detection signal S2.2 exceeds or underruns a predefined value.
c) Within a predefined time period $\Delta t_1$ the first detection signal S2.1, or the second detection signal S2.2, or the first detection signal S2.1 and the second detection signal S2.2 comprise a predefined number of pulses d) The sequence of pulses of the first detection signal S2.1 and of the second detection signal S2.2 comprises a predefined pattern.

The above described examples for an information criterion are not exhaustive and also may be combined.

In the example shown in FIG. 6b an information signal S3 is created, when within a predefined time period $\Delta t_1$ two rising edges are detected each in the first detection signal S2.1 and in the second detection signal S2.2.

The detection signals S2.1 and S2.2 also may be used to detect possible errors (measurement errors or operating errors). For example, two temporally successive pulses in the first detection signal S2.1 may point towards a measurement error, when no pulse of the second detection signal S2.2 is detected between the two pulses.

The above shown threshold values UT and LT as well as the limiting values UL and LL may be adapted dynamically with time, for example to react to changing ambient conditions. The threshold values UT and LT, respectively, also may be adapted for the purpose to not detect as an operational input a only soft or relatively slow squeezing of the electric handheld device G as well as a relatively slow approach/removal of a finger.

The threshold values UT and LT may also be adjusted on the basis of a "test operational input" requested from the user so that the threshold values ultimately may be adapted to the individual requirements of the user.

Figure 7:
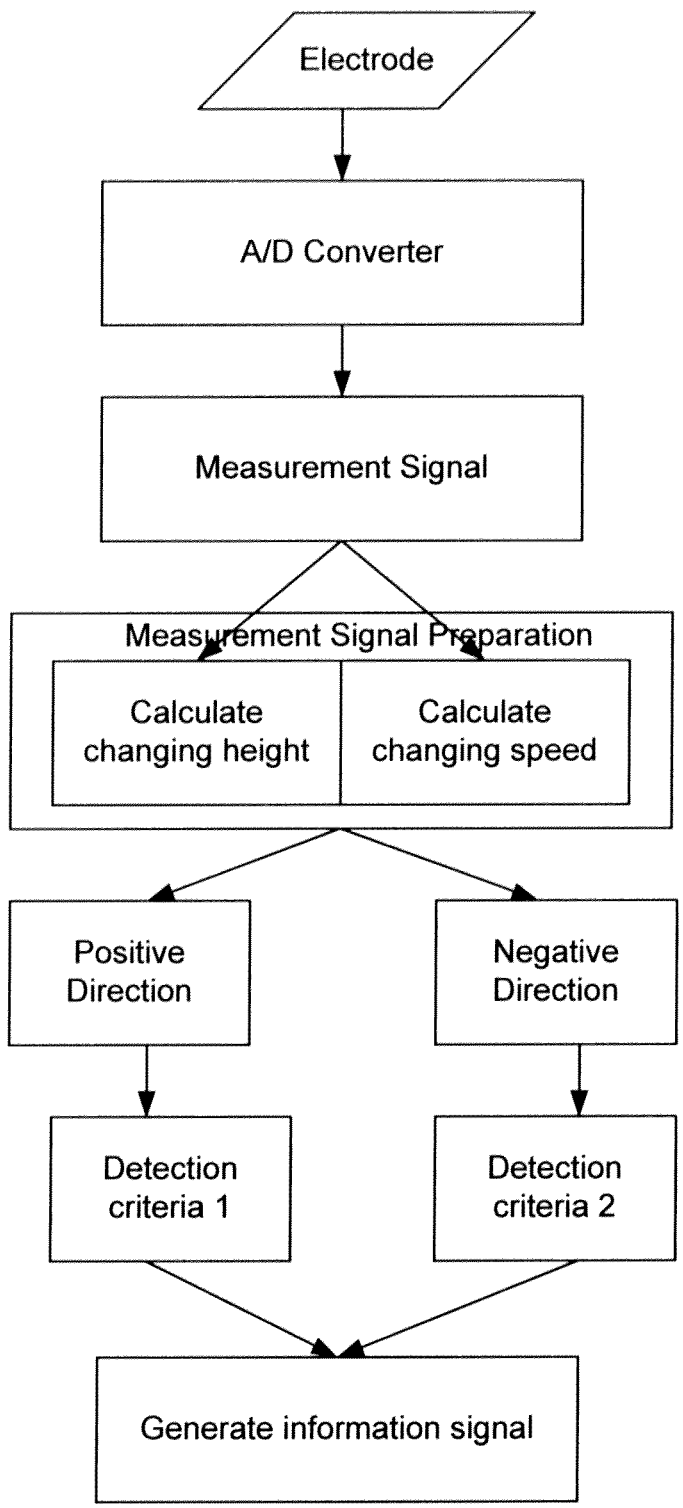
FIG. 7 shows an example of a signal processing according to various embodiments for generating an information signal according to the evaluation method.

FIG. 7 shows an example of a signal processing for creating an information signal according to the evaluation method.

In a first step an electric signal is tapped at the electrode (receiving electrode EE or sensor electrode SE/EE) and is fed to an analog to digital converter, which provides a digital measurement signal for further processing. Subsequently, the digital measurement signal is fed to the measurement signal pre-processing.

In an embodiment also different electric signals may be tapped at the electrode and fed to the analog to digital converter.

For example, two operating modes may be provided for the operation of the sensor device. In a first operating mode (transmission method) the capacitive coupling (transmission or absorption, see FIG. 2a) between the transmitting electrode SE and the receiving electrode EE is detected. The measurement signal assigned to the capacitive coupling is denoted as transmission signal $S_T$. In a second operating mode (loading method) the transmitting electrode SE and/or the receiving electrode EE may be used as loading electrode SE/EE, wherein the capacitive load of the electrode(s) is detected (see FIG. 2b). The measurement signal assigned to the capacitive load is denoted as loading signal $S_L$. When the transmitting electrode SE as well as the receiving electrode EE each are operated as loading electrode SE/EE, then two loading signals $S_{L1}$ and $S_{L2}$ are provided for further processing.

In addition, for example a third electrode (not shown in the figures) may be provided, which preferably is arranged adjacent to the receiving electrode EE. In doing so, in a first operating mode the transmitting electrode SE may be loaded with an electric alternating signal and the capacitive coupling between the transmitting electrode SE and the receiving electrode EE may be detected. The measurement signal assigned to the capacitive coupling between the transmitting electrode SE and the receiving electrode EE is denoted as first transmission signal $S_{T1}$. In the second operating mode the third electrode may be loaded with an electric alternating signal and the capacitive coupling between the third electrode and the receiving electrode may be detected. The measurement signal assigned to the capacitive coupling between the third electrode and the receiving electrode EE is denoted second transmission signal $S_{T2}$. Alternatively, in the second operating mode also the transmitting electrode SE may be loaded with an electric alternating signal so that in the first operating mode only the transmitting electrode and in the second operating mode the transmitting electrode and the third electrode are loaded with an alternating signal.

The two examples mentioned above are not exhaustive and also may be combined.

Created from the digital measurement signals $S_T$ and $S_L$ (and $S_{L1}$, $S_{L2}$, respectively) and $S_{T1}$ and $S_{T2}$, respectively, in a signal processing step not shown in FIG. 7, the measurement signal S1 to be fed to the pre-processing is created. The measurement signal S1 may be created by combining the digital measurement signals. In the first of the two above mentioned examples the digital measurement signal $S_T$ may be combined with the digital measurement signal $S_L$, for example by forming the sum of the measurement signals, wherein the digital measurement signals may be weighted (for example $A^*S_T+B^*S_L$ and $A^*S_T+B^*S_{L1}+C^*S_{L2}$, respectively). Likewise, also the digital measurement signals $S_{T1}$ and $S_{T2}$ according to the second example may be combined with each other. Also created may be the difference of the weighted digital measurement signals. Further variants of a combination of the digital measurement signals are feasible.

In a further embodiment the digital measurement signals may be subjected to a pre-processing before they are combined with each other. For example, digital measurement signals may be subjected to a low-pass filtering before they are combined.

The combined measurement signal S1 or the initial measurement signal S1 (in case no combination of measurement signals was required) such formed are fed to the measurement signal pre-processing.

The measurement signal pre-processing is carried out as described with reference to FIG. 5a, FIG. 5b, FIG. 6a and FIG. 6b. This way, for example the amount of variation of the signal tapped at the electrode (i.e. of the combined or the initial measurement signal) may be determined, as described with reference to FIG. 6a and FIG. 6b.

Alternatively or in addition also the rate of variation of the signal tapped at the electrode may be determined, as described with reference to FIG. 5a and FIG. 5b. The result of the measurement signal pre-processing is one or more reference signals. When the rate of variation as well as the amount of variation are determined, two reference signals may be created and may be used for the further evaluation. This way, for example, detection criteria may be defined, which take into consideration the rate of variation as well as the amount of variation.

The result of the measurement signal pre-processing continuously is monitored and evaluated, respectively. For example, when the amount of variation changes in a positive direction it may be checked whether the variation exceeds the upper threshold value UT or not. In addition it may be tested whether the variation exceeds the upper limiting value UL or not. When the variation lies in the range between the upper threshold value UT and the upper limiting value UL (detection criterion 1) a detection signal S2.2 is created. In an analogous manner this also is true for the variation of the amount in a negative direction as well as for the variation of the rate (rate of variation).

The detection signals S2.1 and S2.2 created such subsequently are fed to a signal evaluation, which is adapted to create an information signal S3. During the forming of the information signal S3 the information criteria mentioned with reference to FIG. 6b may be used. The information signal S3, for example, may contain information about whether a single, double, triple or a multiple input operation (for example a double-click with a finger) has been carried out.

Finally, the information signal S3 for further processing may be fed to the electric handheld device, for example a microcontroller of the handheld device, to activate a device function assigned to the information signal.

An evaluation device A implementing the evaluation method according to various embodiments may be provided together with at least one transmitting electrode SE and at least one receiving electrode EE or together with at least one loading electrode SE/EE in each electric handheld device, which may be grasped by a hand and in which user inputs by means of squeezing, releasing and/or approach/removal of a finger are to be considered.

For example, a respective evaluation device implementing the evaluation method may be provided together with the electrodes SE and EE or together with at least one loading electrode SE/EE in a mobile radio unit, in a computer mouse, in a remote control or in an input device for gaming consoles.

For example, the evaluation device A implementing the evaluation method may be implemented as an ASIC. In addition, the evaluation method also may be implemented in a microcontroller, for example one of a cell phone, wherein the microcontroller in the end only has to provide respective connections for the electrodes SE and EE or SE/EE and has to be designed to subject the analogue sensor signals to a signal pre-processing and to digitize them, respectively. The microcontroller may be a mixed signal microcontroller. In order to provide a respective electric alternating signal, which may be supplied to the transmitting electrode SE and to the loading electrode SE/EE, respectively, the signal generators available in a microcontroller may be used.

Different device functions may be assigned to a detected input. For example, assigned to a single input may be a confirmation function, assigned to a double input may be the retrieving of the phone book of the cell phone.

What is claimed is:

1. An evaluation method for a capacitive contact sensor, which comprises at least one transmitting electrode and at least one receiving electrode, which are able to be brought into a capacitive coupling, wherein at the at least one receiving electrode a measurement signal is tapped, which represents the temporal course of the coupling capacitance between the at least one transmitting electrode and the at least one receiving electrode, from the measurement signal a reference signal is formed, and at least one detection signal is generated when the reference signal meets at least one detection criterion; wherein the measurement signal is low-pass filtered and wherein following the low-pass filtering of the measurement signal a difference signal between the measurement signal and the low-pass filtered measurement signal is formed, wherein the difference signal constitutes the reference signal.

2. The method of claim 1, wherein the generation of the reference signal comprises one of differentiation of the measurement signal and high-pass filtering of the measurement signal.

3. The method of claim 1, wherein the detection criterion comprises an upper threshold value and/or a lower threshold value.

4. The method of claim 3, wherein the detection criterion comprises an upper limiting value and/or a lower limiting value, wherein the upper limiting value lies above the upper threshold value and the lower limiting value lies below the lower threshold value.

5. The method of claim 4, wherein a first detection signal is created, when the reference signal lies below the lower threshold value and above the lower limiting value.

6. The method of claim 4, wherein a second detection signal is created, when the reference signal lies above the upper threshold value and below the upper limiting value.

7. The method of claim 3, wherein a first detection signal is created, when the reference signal lies below the lower threshold value.

8. The method of claim 7, wherein the first detection signal and a second detection signal are digital signals and wherein an information signal is created, when the detection signals meet at least one information criterion.

9. The method of claim 8, wherein the information criterion comprises at least one of
   the temporal interval
      between the rising edges of two pulses of the first detection signal, or
      between the rising edges of two pulses of the second detection signal, or
      between the rising edge of a pulse of the first detection signal and of the rising edge of a pulse of the second detection signal
      exceeds or falls below a predefined value,
   the pulse duration of a pulse of the first detection signal or of a pulse of the second detection signal exceeds or falls below a predefined value,
   within a predefined time period the first detection signal or the second detection signal or the first detection signal and the second detection signal comprise a predefined number of pulses, and
   the sequence of pulses of the first detection signal and of the second detection signal comprises a certain pattern.

10. The method of claim 3, wherein a second detection signal is created, when the reference signal lies above the upper threshold value.

11. The method of claim 1, wherein the coupling capacitance is measured by means of a transmission method or by means of an absorption method.

12. The method of claim 1, wherein the measurement signal is sampled using a predefined first sampling rate, when the signal level of the measurement signal lies below a predefined reference level, and wherein the measurement signal is sampled using a predefined second sampling rate, when the signal level of the measurement signal lies above the predefined reference level.

13. The method of claim 12, wherein the first sampling rate is lower than the second sampling rate.

14. The method of claim 1, wherein the measurement signal is amplified using a predefined first amplification, when the signal level of the measurement signal lies below a predefined reference level, and wherein the measurement signal is amplified using a predefined second amplification, when the signal level of the measurement signal lies above the predefined reference level, wherein the second amplification is chosen such that the measurement signal always is in the operating range of the capacitive contact sensor.

15. The method of claim 1, wherein at the receiving electrode at least one second measurement signal is tapped, wherein prior to creating the reference signal the measurement signal and the at least one second measurement signal are combined with each another, and wherein the reference signal is created from the combined measurement signal.

16. The method of claim 15, wherein the measurement signals are subjected to a signal pre-processing prior to combining.

17. An evaluation device for a capacitive contact sensor, coupled with at least one transmitting electrode and at least one receiving electrode of the capacitive contact sensor and which is adapted to carry out an evaluation method of claim 1.

18. A device, at which at least one transmitting electrode and at least one receiving electrode are arranged, which are coupled with an evaluation device, wherein the evaluation device is adapted to carry out an evaluation method according to claim 1.

19. The device of claim 18, which comprises at least one of a mobile radio unit, a remote control, input means for gaming consoles, portable mini computers, a smart phone, a computer mouse and input means for computer.

20. The device of claim 18, wherein the device is designed in a deformable manner, wherein a deformation of a hand-held device causes a variation of the coupling capacitance between the at least one transmitting electrode and the at least one receiving electrode.

21. An evaluation method for a capacitive contact sensor, wherein the capacitive contact sensor is configured to evaluate an alternating electric field generated by the capacitive contact sensor, wherein a sensor electrode generates a measurement signal, and wherein from the measurement signal a reference signal is formed, and at least one detection signal is generated, when the reference signal meets at least one detection criterion;
wherein the measurement signal is low-pass filtered and wherein following the low-pass filtering of the measurement signal a difference signal between the measurement signal and the low-pass filtered measurement signal is formed, wherein the difference signal constitutes the reference signal.

22. The method of claim 21, wherein the generation of the reference signal comprises one of differentiation of the measurement signal and high-pass filtering of the measurement signal.

23. The method of claim 21, wherein the detection criterion comprises an upper threshold value and/or a lower threshold value.

24. The method of claim 23, wherein the detection criterion comprises an upper limiting value and/or a lower limiting value, wherein the upper limiting value lies above the upper threshold value and the lower limiting value lies below the lower threshold value.

25. The method of claim 24, wherein a first detection signal is created, when the reference signal lies below the lower threshold value and above the lower limiting value.

26. The method of claim 24, wherein a second detection signal is created, when the reference signal lies above the upper threshold value and below the upper limiting value.

27. The method of claim 23, wherein a first detection signal is created, when the reference signal lies below the lower threshold value.

28. The method of claim 27, wherein the first detection signal and a second detection signal are digital signals and wherein an information signal is created, when the detection signals meet at least one information criterion.

29. The method of claim 28, wherein the information criterion comprises at least one of
the temporal interval
between the rising edges of two pulses of the first detection signal, or
between the rising edges of two pulses of the second detection signal, or
between the rising edge of a pulse of the first detection signal and of the rising edge of a pulse of the second detection signal
exceeds or falls below a predefined value,
the pulse duration of a pulse of the first detection signal or of a pulse of the second detection signal exceeds or falls below a predefined value,
within a predefined time period the first detection signal or the second detection signal or the first detection signal and the second detection signal comprise a predefined number of pulses, and
the sequence of pulses of the first detection signal and of the second detection signal comprises a certain pattern.

30. The method of claim 23, wherein a second detection signal is created, when the reference signal lies above the upper threshold value.

31. The method of claim 21, wherein the measurement signal is sampled using a predefined first sampling rate, when the signal level of the measurement signal lies below a predefined reference level, and wherein the measurement signal is sampled using a predefined second sampling rate, when the signal level of the measurement signal lies above the predefined reference level.

32. The method of claim 31, wherein the first sampling rate is lower than the second sampling rate.

33. The method of claim 21, wherein the measurement signal is amplified using a predefined first amplification, when the signal level of the measurement signal lies below a predefined reference level, and wherein the measurement signal is amplified using a predefined second amplification, when the signal level of the measurement signal lies above the predefined reference level, wherein the second amplification is chosen such that the measurement signal always is in the operating range of the capacitive contact sensor.

34. The method of claim 21, wherein prior to creating the reference signal the measurement signal and at least one second measurement signal are combined with each another, and wherein the reference signal is created from the combined measurement signal.

35. The method of claim 34, wherein the measurement signals are subjected to a signal pre-processing prior to combining.

* * * * *